United States Patent [19]

Tseng

[11] Patent Number: 5,677,221
[45] Date of Patent: Oct. 14, 1997

[54] METHOD OF MANUFACTURE DRAM CAPACITOR WITH REDUCED LAYOUT AREA

[75] Inventor: Horng-Huei Tseng, Hsinchu, Taiwan

[73] Assignee: Vanguard International Semiconductor Corp., Hsinchu, Taiwan

[21] Appl. No.: 666,801

[22] Filed: Jun. 19, 1996

[51] Int. Cl.[6] .................................................. H01L 21/70
[52] U.S. Cl. ............................ 437/52; 437/60; 437/919
[58] Field of Search ............................. 437/47, 48, 52, 437/60, 919

[56] References Cited

U.S. PATENT DOCUMENTS

| | | | |
|---|---|---|---|
| 5,137,842 | 8/1992 | Chan et al. | 437/48 |
| 5,399,518 | 3/1995 | Sim et al. | 437/52 |
| 5,478,769 | 12/1995 | Lim | 437/52 |
| 5,510,289 | 4/1996 | Choi | 437/60 |

*Primary Examiner*—John Niebling
*Assistant Examiner*—Joni Y. Chang
*Attorney, Agent, or Firm*—Christensen O'Connor Johnson & Kindness, PLLC

[57] ABSTRACT

A method of manufacturing a capacitor for use in a DRAM. The method includes forming an isolation layer over a substrate, forming a nitride layer over the isolation layer, forming a hole in the isolation and nitride layers, forming a polysilicon plug in the hole, growing an oxide plug from an upper portion of the polysilicon plug, removing the nitride layer, forming a polysilicon spacer around the oxide plug, and removing the silicon dioxide plug. Additional steps include depositing a dielectric layer onto the polysilicon sidewall and plug, and depositing a third polysilicon layer onto the dielectric layer.

20 Claims, 4 Drawing Sheets

METHOD OF MANUFACTURE DRAM CAPACITOR WITH REDUCED LAYOUT AREA

FIELD OF THE INVENTION

This present invention relates to semiconductor capacitors, and more specifically, to a high capacitance memory cell capacitor and a method of manufacturing the same.

BACKGROUND OF THE INVENTION

Current trends in Dynamic Random Access Memory (DRAM) technology include designing DRAM integrated circuits that can operate at lower voltages. The need for low voltage operation is driven by the voltage limitations of new process technology, by the handheld systems market and by the high density system power dissipation limitations. The DRAM industry will very likely continue efforts to achieve higher density.

New developments in materials will facilitate the trend to increase density. DRAM capacitors will benefit from high dielectric constant materials, such as ferroelectric materials, that will enable capacitors to achieve high capacitance without increasing the capacitor size.

Great progress has been made in the manufacture of DRAMs using high density integrated circuit technology. The industry has progressed from DRAMs of 16Kbit capacity to DRAMs of up to 64Mbit capacity. A major factor is increasing the density of DRAMs is the reduction in size of the DRAM storage cell. A storage cell for semiconductor integrated circuit DRAMs typically includes a capacitor and an access transistor. Either the source or drain of the transistor is connected to one terminal of the capacitor. The transistor gate electrode and the other end of the transistor's channel are connected to external interconnect lines called a word line and a bit line, respectively. The other terminal of the capacitor is connected to a reference voltage. Therefore, the formation of the DRAM memory cell comprises the formation of a transistor, a capacitor and contacts to external circuits. Typical DRAM memory cells use planar capacitors, which are relatively simple to manufacture, but occupy a relatively large area of the integrated circuit surface.

In order to achieve high performance, memory devices in DRAM technology are scaled down to the submicrometer range. In general, to increase the density of the DRAMs, the size of the memory cells must decrease. For very small memory cells, the limitations of planar capacitors make them very difficult to use reliably. Specifically, as the size of the planar capacitor decreases, the capacitance of the capacitor also decreases. Consequently, the size of the charge capable of being stored by the capacitor decreases. This results in the capacitor being very susceptible to α particle interference. Additionally, as the capacitance decreases, the charge held by the storage capacitor must be refreshed more often.

Prior art approaches to overcome these problems have resulted in the development of the trench capacitor (see U.S. Pat. No. 5,374,580) and the stacked capacitor. The trench capacitor has the well-known problem of "gated diode leakage," which is the leakage of current resulting in the trench capacitor failing to hold a charge.

Another way to increase the capacitance per unit area occupied by the capacitor is to etch a groove in the capacitor, thereby increasing the surface area of the capacitor. See, for example, U.S. Pat. No. 4,225,945 and U.S. Pat. No. 5,374,580. Reducing the thickness of the dielectric can also improve the capacitance of the capacitor, but this approach is limited because of yield and reliability problems caused by the thinness of the dielectric.

SUMMARY

In accordance with the present invention, a method of manufacturing capacitors for use in an integrated circuit Dynamic Random Access Memory (DRAM) is disclosed. In one embodiment, the method includes the steps of forming an isolation layer over a MOS (the term MOS is used herein to also refer to silicon gate technologies) transistor formed in and on a semiconductor substrate. A nitride layer is then formed on the isolation layer. A contact hole is then formed through the nitride and isolation layers, exposing a source/drain region of the MOS transistor.

Next, a first polysilicon layer is formed on the nitride layer and in the contact hole, which is then etched to form a polysilicon plug. The upper portion of the polysilicon plug is then oxidized, thereby forming a silicon dioxide plug attached to the remaining portion of the polysilicon plug. The oxide plug extends out of the contact hole, with the bottom end of the oxide plug within the contact hole but remaining above the isolation layer. The nitride layer is removed, exposing the top surface of the isolation layer and, thus, the sidewalls of the upper portion of the remaining portion of the polysilicon plug.

A second polysilicon layer is formed over the isolation layer and the plugs. The second polysilicon layer is anisotropically etched, forming a polysilicon spacer structure adjoining the sidewalls of the silicon dioxide plug, the upper portion of the polysilicon plug and the upper surface of the isolation layer proximate to the polysilicon plug. The silicon dioxide plug is then removed, exposing the top surface of the polysilicon plug. In addition, the polysilicon spacer structure remains attached to the upper portion of the polysilicon plug, thereby forming a node electrode of a capacitor. Because of the spacer structure, this electrode has a relatively large surface area relative to conventional capacitor node electrodes occupying the same surface area on the wafer. Then a dielectric layer is formed over the node electrode and isolation layer. A third polysilicon layer is then formed on the dielectric layer, thereby forming the other electrode of the capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
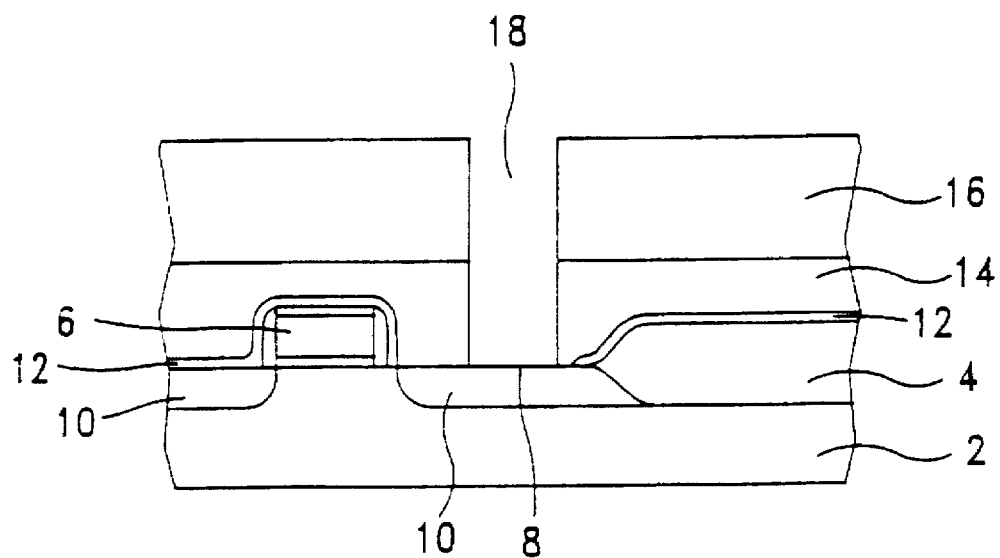
FIG. 1 is a cross section view of a semiconductor wafer illustrating the formation of an isolation layer and a nitride layer on a semiconductor substrate.

The formation of a Dynamic Random Access Memory (DRAM) capacitor described herein. Referring to FIG. 1, a silicon wafer is illustrated in cross-section. The silicon wafer includes a single crystal substrate 2, a field oxide 4, gate electrodes 6, contact windows 8, and impurity regions 10. In this embodiment, the single crystal substrate 2 is P-type with a<100>crystallographic orientation.

The field oxide (FOX)4 is created for purposes of isolating the adjacent structures. Generally, the FOX 4 region is created using well known photolithography and dry etching steps. This process consists of creating a photolithographic mask containing the pattern of the component to be formed, coating the wafer with a light sensitive material called a photoresist, exposing the photoresist coated wafer to ultraviolet light through the mask to soften or harden parts of the photoresist (depending on whether positive or negative photoresist is used), removing the softened parts of the photoresist, etching to remove the materials left unprotected by the photoresist and stripping the remaining photoresist. This photolithographic masking and etching process is commonly referred to as "patterning and etching".

In this embodiment, a silicon nitride-silicon dioxide composite layer is deposited onto the substrate 2. A photoresist is applied to the composite layer that delineates the FOX 4 region. After the photoresist is removed, and wet cleaned, thermal oxidation in an oxygen stem environment is used to form FOX 4. Preferably, FOX 4 has a thickness of about 4000–6000 angstroms.

A MOS transistor is formed in the substrate 2. The transistor includes a gate electrode 6 formed on substrate 2, with source and drain impurity regions 10 formed in the substrate 2 between the gate electrodes 6. The formation of the access transistors for DRAMs is well known in the art and are not particularly germane to the present invention. Thus, only a cursory description of forming access transistors is given here.

An oxide layer 12 is formed over the gate electrodes 6, the impurity regions 10, and the FOX 4. The oxide layer 12 is composed of nitride or undoped oxide layer. In this embodiment, the oxide layer 12 is deposited using any suitable deposition process, to a thickness of about 500–2000 angstroms. A conventional etching step is used to etch the oxide layer 12 to expose one of the impurity regions 10.

Then an isolation layer 14 is formed over the oxide layer 12 and the exposed impurity region 10 using low pressure chemical vapor deposition (LPCVD). It can be appreciated that other methods of depositing the isolation layer 14 can also be used. In this embodiment, the isolation layer 14 is made of borophosphosilicate glass (BPSG). The thickness of the BPSG layer 14 is between about 3000–6000 angstroms. Next, a second nitride layer 16 is formed on the BPSG layer 14, having a thickness about 3000–8000 angstroms.

Subsequently, a patterning and etching process is performed to create a contact hole 18. A contact window 8 is formed to allow the source and drain of the transistor to be electrically connected to the capacitor of the present invention. The contact window 8 is formed using any suitable pattern and etching technique.

Figure 2:
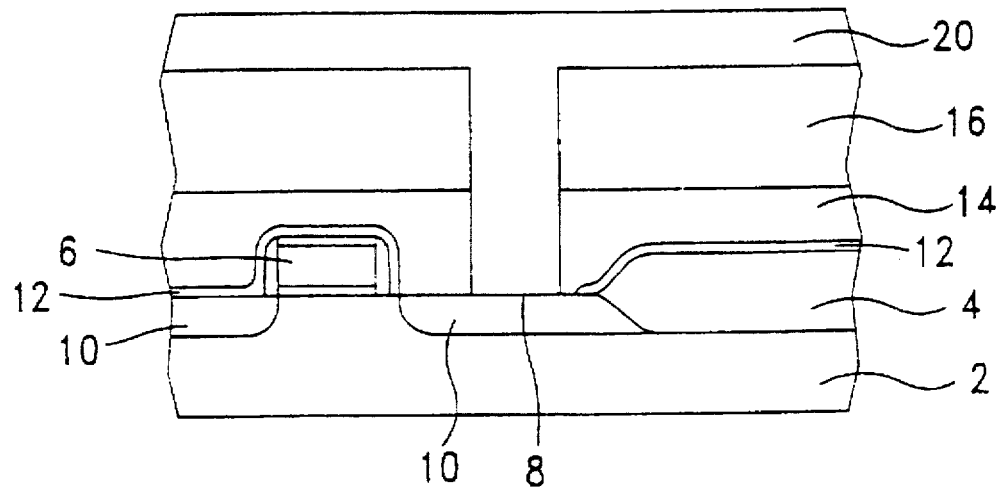
FIG. 2 is a cross section view of a semiconductor wafer illustrating the formation of a first polysilicon layer on a semiconductor substrate.

As shown in FIG. 2, a first polysilicon layer 20 is formed on the nitride layer 16, whereby the contact hole 18 is filled with the first polysilicon layer 20. The first polysilicon layer 20 is formed of low pressure chemical vapor deposition of doped polysilicon or in-situ phosphorus doped polysilicon.

Figure 3:
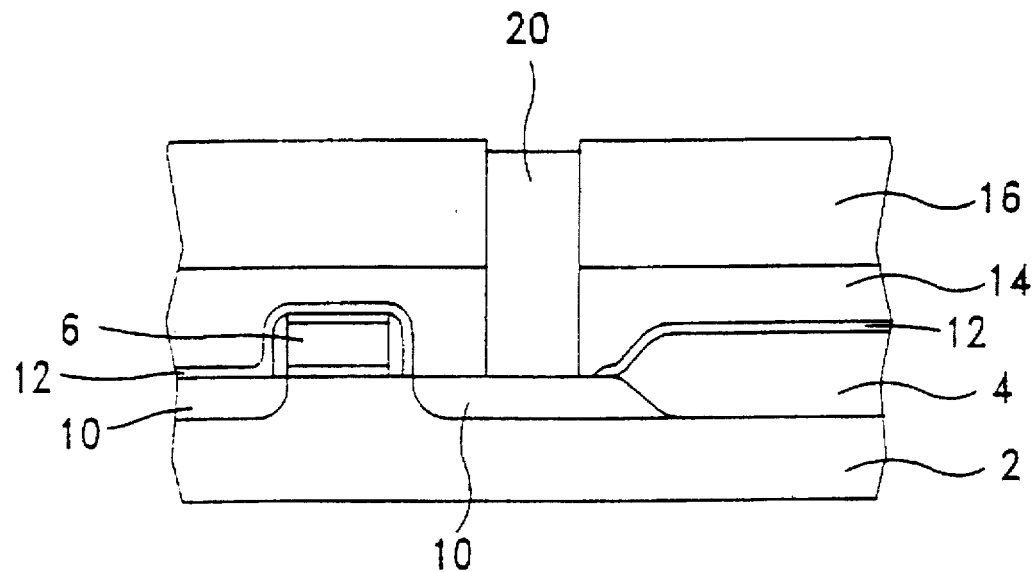
FIG. 3 is a cross section view of a semiconductor wafer illustrating the etching of the first polysilicon layer.

Turning next to FIG. 3, an anisotropic etching process is performed to etch back the first polysilicon layer 20 until the surface of the nitride layer 16 is exposed. As shown in FIG. 3, a polysilicon plug 20 is generated as a node contact. The width of the node contact is about 0.3–0.7 micron meter.

Figure 4:
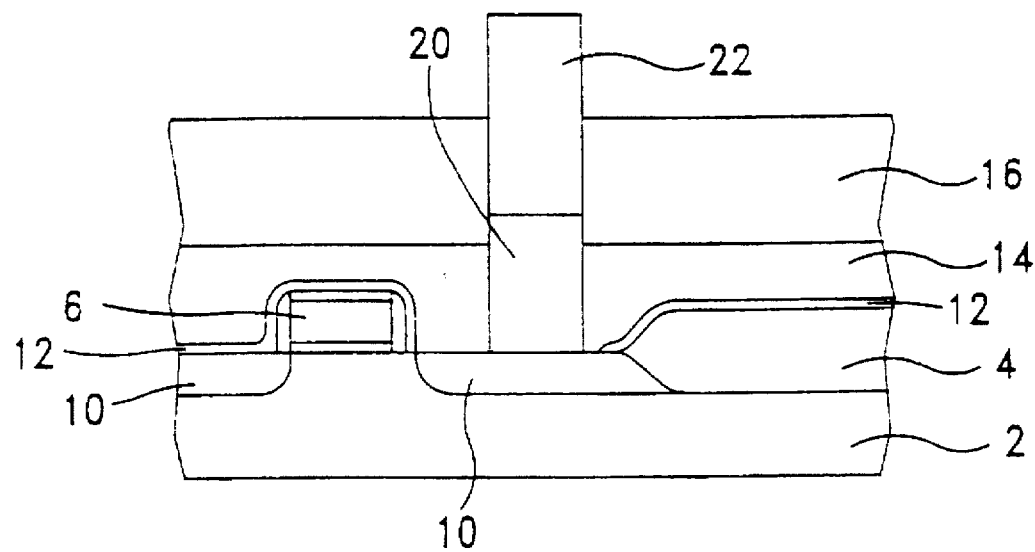
FIG. 4 is a cross section view of a semiconductor wafer illustrating the formation of the silicon oxide plug.

Turning to FIG. 4, a thermal oxidation step is performed to grow a silicon dioxide plug 22 from the upper portion of the polysilicon plug 20. The temperature of the thermal oxidation is about 750°–850° C. In preferred embodiment, a high pressure thermal oxdation is used. As shown in FIG. 4, the oxide plug 22 extends out of the contact hole and above the nitride layer 16, but does not extend below the lower surface of the nitride layer 16.

Figure 5:
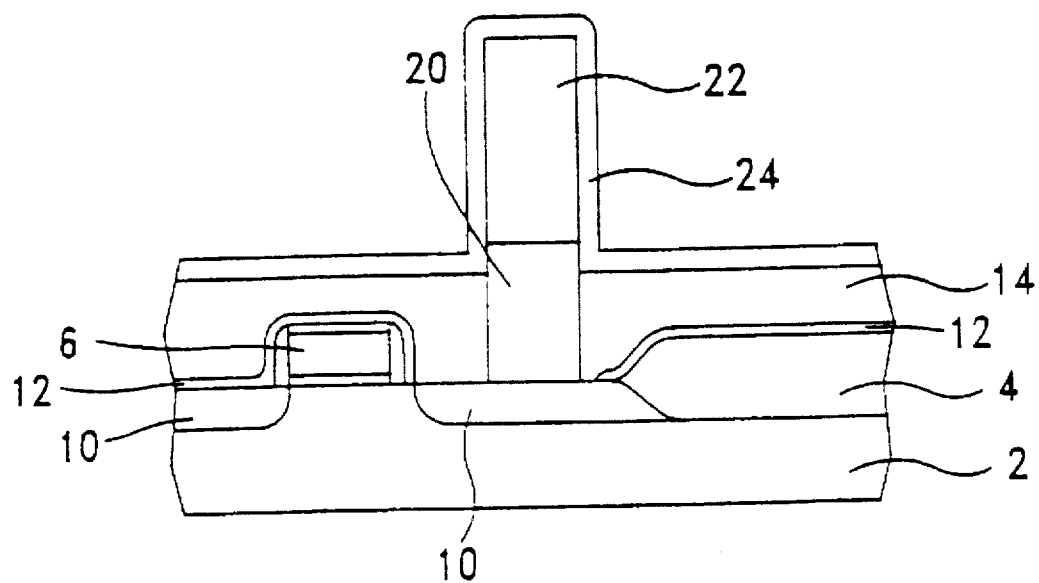
FIG. 5 is a cross section view of a semiconductor wafer illustrating the stripping of the nitride layer and the formation of a second polysilicon layer.

Next, as shown in FIG. 5, the nitride layer 16 is stripped using a conventional oxygen plasma etching technique. As a result, the sidewalls of the upper portion of the remaining polysilicon plug 20 is exposed. Then a second polysilicon layer 24 is formed on the BPSG layer 14, the sidewalls of the upper portion of the polysilicon plug 20, and the silicon dioxide plug 22. The second polysilicon layer 24 is deposited using any suitable deposition technique. The second polysilicon layer 24 can be doped polysilicon or in-situ doped polysilicon. In this embodiment, the thickness of the second polysilicon layer 24 is about 500–2000 angstroms.

Figure 6:
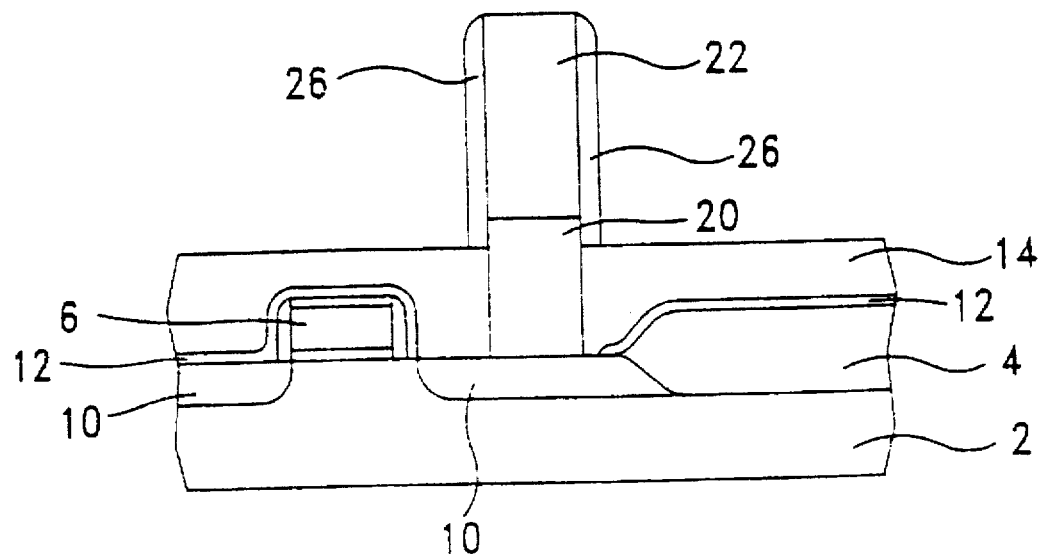
FIG. 6 is a cross section view of a semiconductor wafer illustrating the formation of the side wall spacer.

Next, referring to FIG. 6, the second polysilicon layer 24 is anisotropically etched using a dry etching process until the top surface of the oxide plug 22 is exposed. As a result, a polysilicon spacer 26 is formed around the oxide plug 22 and the upper portion of the polysilicon plug 20.

Figure 7:
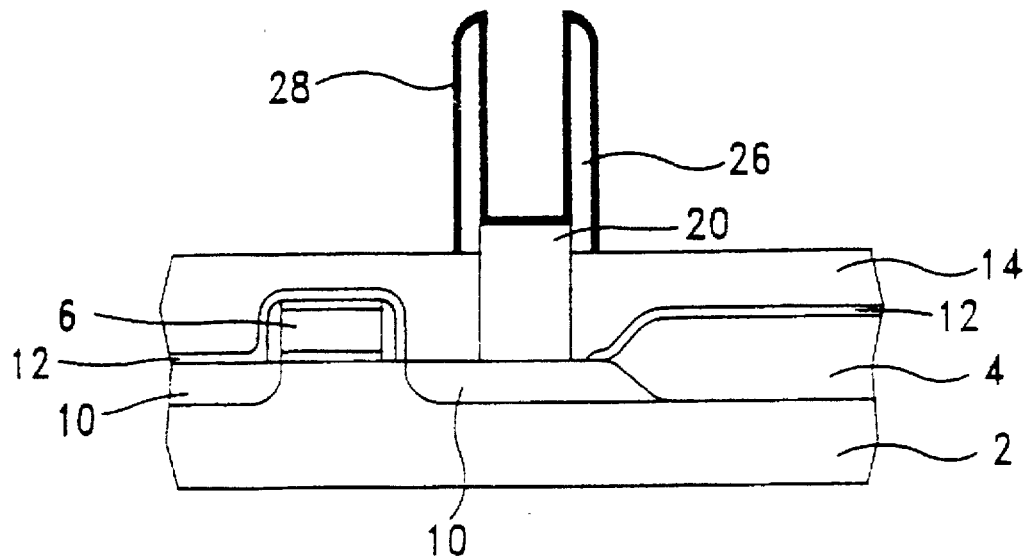
FIG. 7 is a cross section view of a semiconductor wafer illustrating the formation of a dielectric layer on the first polysilicon layer.

Then, referring to FIG. 7, the silicon dioxide plug 22 is removed by dry etching. In addition, this dry etch step removes an upper portion of the BPSG layer 14. In an alternative embodiment, the oxide layer 12 can be replaced with a nitride layer. In this alternative embodiment, this dry etching step can be continued to totally remove the BPSG layer 14. As a result, the polysilicon spacer 26 and the polysilicon plug 20 form a node (or bottom storage) electrode of a capacitor for a DRAM cell.

Next, a dielectric film 28 is formed along the surface of the polysilicon spacer 26 and the first polysilicon layer 20. The dielectric film 28 is can be formed from a double film of nitride/oxide film, a triple form of oxide/nitride/oxide, or any other high dielectric film such as tantalum oxide ($Ta_2O_5$). The resultant structure is shown in FIG. 7.

Figure 8:
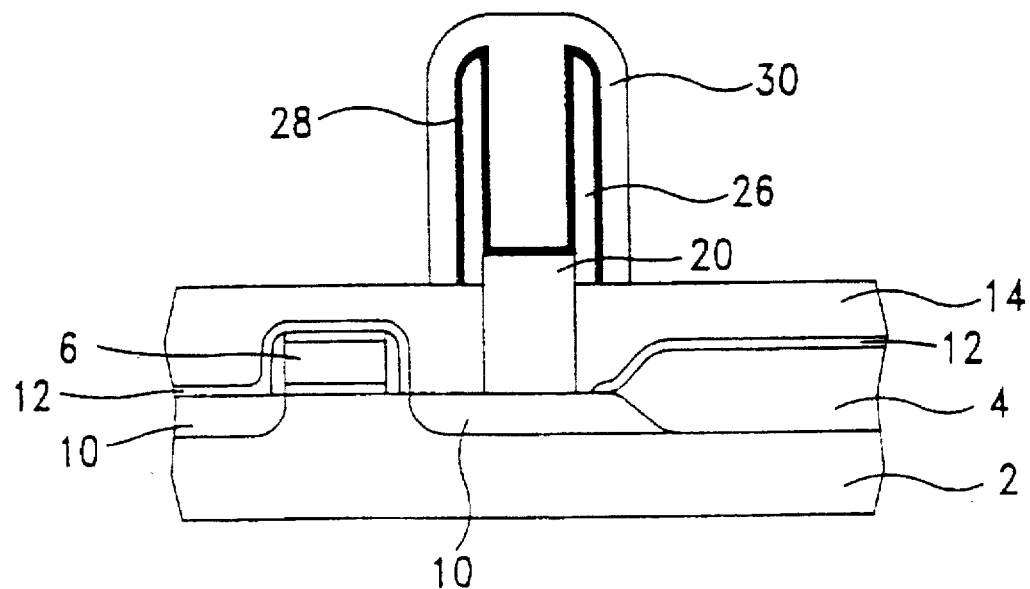
FIG. 8 is a cross section view of a semiconductor wafer illustrating formation of a third polysilicon layer on the dielectric layer.

Turning next to FIG. 8, a third polysilicon layer 30 is formed atop the entire structure of FIG. 7. In this embodiment, the third polysilicon layer is formed of low pressure chemical vapor deposition. Preferably, the third polysilicon layer 30 is formed of doped polysilicon or in-situ doped polysilicon. The thickness of the thire polysilicon is about 1000–2000 angstroms. The third polysilicon layer 30 is then patterned and etched to form the upper electrode of the DRAM cell capacitor. The resulting capacitor is formed from the first polysilicon layer 20, the polysilicon spacer 26, the dielectric film 28, and the third polysilicon layer 30. The first polysilicon layer 20 and second polysilicon layer 24 are used to form bottom storage electrode while the third polysilicon layer 30 is served as top storage electrode.

As is understood by a person skilled in the art of DRAM fabrication, the foregoing description of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing an integrated circuit capacitor on a semiconductor substrate, the method comprising:

forming an isolation layer on said semiconductor substrate;

forming a first nitride layer on said isolation layer;

etching said first nitride layer and said isolation layer so as to form a contact hole;

forming a first polysilicon layer on said first nitride layer, wherein said contact hole is substantially filled with polysilicon from said first polysilicon layer;

etching back said first polysilicon layer, wherein a polysilicon plug is formed in said contact hole;

forming an oxide plug from said polysilicon plug, wherein said oxide plug extends out of said contact hole;

removing said first nitride layer;

forming a second polysilicon layer on said isolation layer and said silicon dioxide plug;

etching said second polysilicon layer so as to form a spacer on the side wall of said silicon dioxide plug; and removing said silicon dioxide plug.

2. The method of claim 1 further comprising:

forming a dielectric film on a surface of said first conductive layer and said side wall spacer;

forming a third polysilicon layer on said dielectric film; and patterning and etching said third polysilicon layer.

3. The method of claim 1, wherein removing said silicon dioxide plug comprises removing a portion of said isolation layer.

4. The method of claim 1, further comprising:

forming an oxide layer before said isolation layer is formed; and etching said oxide layer to form a contact window, wherein said contact window exposes a portion of said substrate.

5. The method of claim 4, wherein said oxide layer has a thickness of about 500 to about 2000 angstroms.

6. The method of claim 5, wherein said oxide layer is undoped oxide.

7. The method of claim 1, further comprising:

forming a second nitride layer before forming said isolation layer; and etching said second nitride layer to form a contact window, wherein said contact window exposes a portion of said substrate.

8. The method of claim 7, further comprising removing said isolation layer.

9. The method of claim 1, wherein said isolation layer comprises borophosphosilicate glass (BPSG).

10. The method of claim 9, wherein said isolation layer has a thickness of about 3000 to about 6000 angstroms.

11. The method of claim 1, wherein said first nitride layer has a thickness of about 3000 to about 8000 angstroms.

12. The method of claim 1, wherein said polysilicon has a width about 0.3 to about 0.7 micrometers.

13. The method of claim 1, wherein oxide plug is formed by thermal oxidation.

14. The method of claim 1 wherein said thermal oxidation is performed with a temperature of about 750° to about 850° C.

15. The method of claim 1, wherein said second polysilicon layer has a thickness of about 500 to about 2000 angstroms.

16. The method of claim 2, wherein said first polysilicon layer, said second polysilicon layer and said third polysilicon layer comprise doped polysilicon.

17. The method of claim 16 wherein said first polysilicon layer, said second polysilicon layer or said third polysilicon layer comprise in-situ doped polysilicon.

18. The method of claim 2, wherein said dielectric film comprises $Ta_2O_5$.

19. A method of forming a polysilicon structure on a substrate, said method comprising:

forming an isolation layer on said substrate;

forming a nitride layer on said isolation layer;

forming a hole through said nitride layer and said isolation to expose said substrate;

forming a first polysilicon layer on said nitride layer, wherein said hole is substantially filled with polysilicon from said first polysilicon layer;

etching back said first polysilicon layer to form a polysilicon plug in said hole;

growing an oxide plug from an upper portion of said polysilicon plug;

removing said nitride layer;

forming a second polysilicon layer on said isolation layer and said oxide plug;

etching said second polysilicon layer so as to form a spacer on a side wall of said oxide plug; and removing said silicon dioxide plug.

20. A method of forming a polysilicon structure on a substrate, said method comprising:

forming a plug having polysilicon portion contacting said substrate and an oxide portion on top of said polysilicon portion;

forming a polysilicon spacer on a side wall of said plug, said spacer contacting at least an upper portion of said polysilicon portion and a lower portion of said oxide portion; and removing said oxide portion, wherein said polysilicon spacer is attached to said upper portion of said polysilicon portion.

* * * * *